US012289187B2

United States Patent
Chen et al.

(10) Patent No.: US 12,289,187 B2
(45) Date of Patent: Apr. 29, 2025

(54) ISOLATION INTEGRATED CIRCUIT, CARRIER FREQUENCY CONTROL CIRCUIT AND MODULATION SIGNAL GENERATION METHOD

(71) Applicant: PowerX Semiconductor Corporation, Hsinchu County (TW)

(72) Inventors: Yong Cyuan Chen, Hsinchu County (TW); Jui Teng Chan, Hsinchu County (TW); Chung-Kang Wu, Hsinchu County (TW)

(73) Assignee: PowerX Semiconductor Corporation, Hsinchu County (TW)

( * ) Notice: Subject to any disclaimer, the term of this patent is extended or adjusted under 35 U.S.C. 154(b) by 0 days.

(21) Appl. No.: 18/395,631

(22) Filed: Dec. 25, 2023

(65) Prior Publication Data

US 2025/0062940 A1 Feb. 20, 2025

(30) Foreign Application Priority Data

Aug. 18, 2023 (TW) .................................. 112131197

(51) Int. Cl.
*H04L 27/04* (2006.01)
*H03C 1/62* (2006.01)
*H03K 7/02* (2006.01)

(52) U.S. Cl.
CPC ............... *H04L 27/04* (2013.01); *H03C 1/62* (2013.01); *H03K 7/02* (2013.01)

(58) Field of Classification Search
CPC ............. H04L 27/04; H03C 1/62; H03K 7/02
See application file for complete search history.

(56) References Cited

U.S. PATENT DOCUMENTS

2014/0169038 A1 6/2014 Kamath et al.
2024/0146588 A1* 5/2024 Uo .......................... H04B 1/40

FOREIGN PATENT DOCUMENTS

| CN | 113922760 A | 1/2022 |
| CN | 115118294 A | 9/2022 |
| TW | I517586 B | 1/2016 |
| TW | I758230 B | 3/2022 |

* cited by examiner

*Primary Examiner* — Ryan Johnson
(74) *Attorney, Agent, or Firm* — CKC & Partners Co., LLC

(57) ABSTRACT

The present disclosure provides an isolation integrated circuit, a carrier frequency control circuit and a modulation signal generation method. The isolation integrated circuit includes a carrier frequency generation circuit, a carrier frequency control circuit and a modulation circuit. The carrier frequency generation circuit generates a carrier frequency signal. The carrier frequency control circuit detects enabling periods and disabling periods of an input signal, controls the carrier frequency generation circuit to output the carrier frequency signal during the enabling periods, and controls the carrier frequency generation circuit to stop outputting the carrier frequency signal in the output periods of timing pulses during the disabling periods. The timing pulses are generated in response to detection of entering the disabling periods. The modulation circuit receives the input signal and the carrier frequency signal, and outputs a modulation signal according to the input signal and the carrier frequency signal.

20 Claims, 6 Drawing Sheets

ISOLATION INTEGRATED CIRCUIT, CARRIER FREQUENCY CONTROL CIRCUIT AND MODULATION SIGNAL GENERATION METHOD

RELATED APPLICATIONS

This application claims priority to Taiwan Application Serial Number 112131197, filed, Aug. 18, 2023, which is herein incorporated by reference.

BACKGROUND

Field of Disclosure

The present disclosure relates to a carrier frequency control circuit and a modulation signal generation method, and particularly relates to a carrier frequency control circuit and a modulation signal generation method applied to an isolation integrated circuit.

Description of Related Art

In some related arts for modulation signal generation, a modulator is generally configured to generate a modulation signal by modulating an input signal via a carrier frequency signal output by an oscillator. However, these related arts cause the oscillator to continuously output the carrier frequency signal even when the carrier frequency signal is not needed, which results in an increase in power consumption of the circuit.

SUMMARY

An embodiment of the present disclosure is an isolation integrated circuit. The isolation integrated circuit includes a primary circuit, an isolating circuit and a secondary circuit. The primary circuit includes a carrier frequency generation circuit, a carrier frequency control circuit and a modulation circuit. The carrier frequency generation circuit is configured to generate a carrier frequency signal. The carrier frequency control circuit is electrically coupled to the carrier frequency generation circuit, and configured to detect at least one enabling period and at least one disabling period of an input signal, to control the carrier frequency generation circuit to output the carrier frequency signal during the at least one enabling period, and to control the carrier frequency generation circuit to stop outputting the carrier frequency signal in an output period of at least one timing pulse during the at least one disabling period, wherein the at least timing pulse is generated in response to detection of entering the at least one disabling period, and when an output period of one of the at least one timing pulse does not overlap with one of the at least one enabling period directly after the one of the at least one timing pulse, an output period of a subsequent one of the at least one timing pulse is adjusted. The modulation circuit is electrically coupled to the carrier frequency generation circuit, and configured to receive the input signal and the carrier frequency signal, and to output a modulation signal according to the input signal and the carrier frequency signal. The isolating circuit is coupled to the primary circuit and configured to transmit the modulation signal. The secondary circuit is coupled to the isolating circuit and configured to receive the modulation signal through the isolating circuit and to generate an output signal according to the modulation signal.

An embodiment of the present disclosure is a carrier frequency control circuit. The carrier frequency control circuit is electrically coupled to a carrier frequency generation circuit and configured to receive an input signal, and includes an edge detection circuit, a timing pulse generation circuit and an on-off control circuit. The edge detection circuit is configured to output at least one rising signal during at least one enabling period of the input signal and to output at least one falling signal during at least one disabling period of the input signal. The timing pulse generation circuit is electrically coupled to the edge detection circuit, and configured to output a frequency filtering signal and to generate at least one timing pulse by adjusting a voltage level of the frequency filtering signal according to the at least one falling signal, wherein when an output period of one of the at least one timing pulse does not overlap with one of the at least one enabling period directly after the one of the at least one timing pulse, an output period of a subsequent one of the at least one timing pulse is adjusted. The on-off control circuit is electrically coupled to the carrier frequency generation circuit, the edge detection circuit and the timing pulse generation circuit, and configured to control the carrier frequency generation circuit to output the carrier frequency signal according to the at least one rising signal, and to control the carrier frequency generation circuit to stop outputting the carrier frequency signal according to the at least one timing pulse.

An embodiment of the present disclosure is a modulation signal generation method. The modulation signal generation method is implemented with an isolation integrated circuit, wherein the isolation integrated circuit includes a carrier frequency generation circuit, a carrier frequency control circuit and a modulation circuit, and the modulation signal generation method includes: detecting, by the carrier frequency control circuit, at least one enabling period and at least one disabling period of an input signal; during the at least one enabling period, controlling, by the carrier frequency control circuit, the carrier frequency generation circuit to output a carrier frequency signal; and during the at least one disabling period, controlling, by the carrier frequency control circuit, the carrier frequency generation circuit to stop outputting the carrier frequency signal in an output period of at least one timing pulse, wherein the at least timing pulse is generated in response to detection of entering the at least one disabling period, and when an output period of one of the at least one timing pulse does not overlap with one of the at least one enabling period directly after the one of the at least one timing pulse, an output period of a subsequent one of the at least one timing pulse will be adjusted; and generating, by the modulation circuit, a modulation signal according to the input signal and the carrier frequency signal.

In summary, the carrier frequency control circuit of the present disclosure detects an enabling period and a disabling period of an input signal, and controls the carrier frequency generation circuit to stop outputting a carrier frequency signal in an output period of a timing pulse during the disabling period of the input signal. Therefore, compared to related arts that cause continuous outputting of a carrier frequency signal during a disabling period of an input signal, the isolation integrated circuit 100 of the present disclosure has a lower power consumption.

DETAILED DESCRIPTION

The following is a detailed description of embodiments in conjunction with the drawings. However, the specific embodiments described are only intended to explain the present disclosure, rather than to limit the present disclosure. The description of structural operations is not used to limit the order of execution thereof. Devices with equal effects, structurally formed by the recombination of elements, are all within the scope of the present disclosure.

Terms used throughout the specification and the claims of the present disclosure, unless otherwise specified, generally have the ordinary meaning of each term used in the art, in the present disclosure and in special contents.

The term "coupled" or "coupled" used herein may indicate that two or more elements are in direct physical or electrical contact with each other, or that two or more elements are in indirect physical or electrical contact with each other, and also may indicate that two or more elements co-operate or interact with each other.

Figure 1:
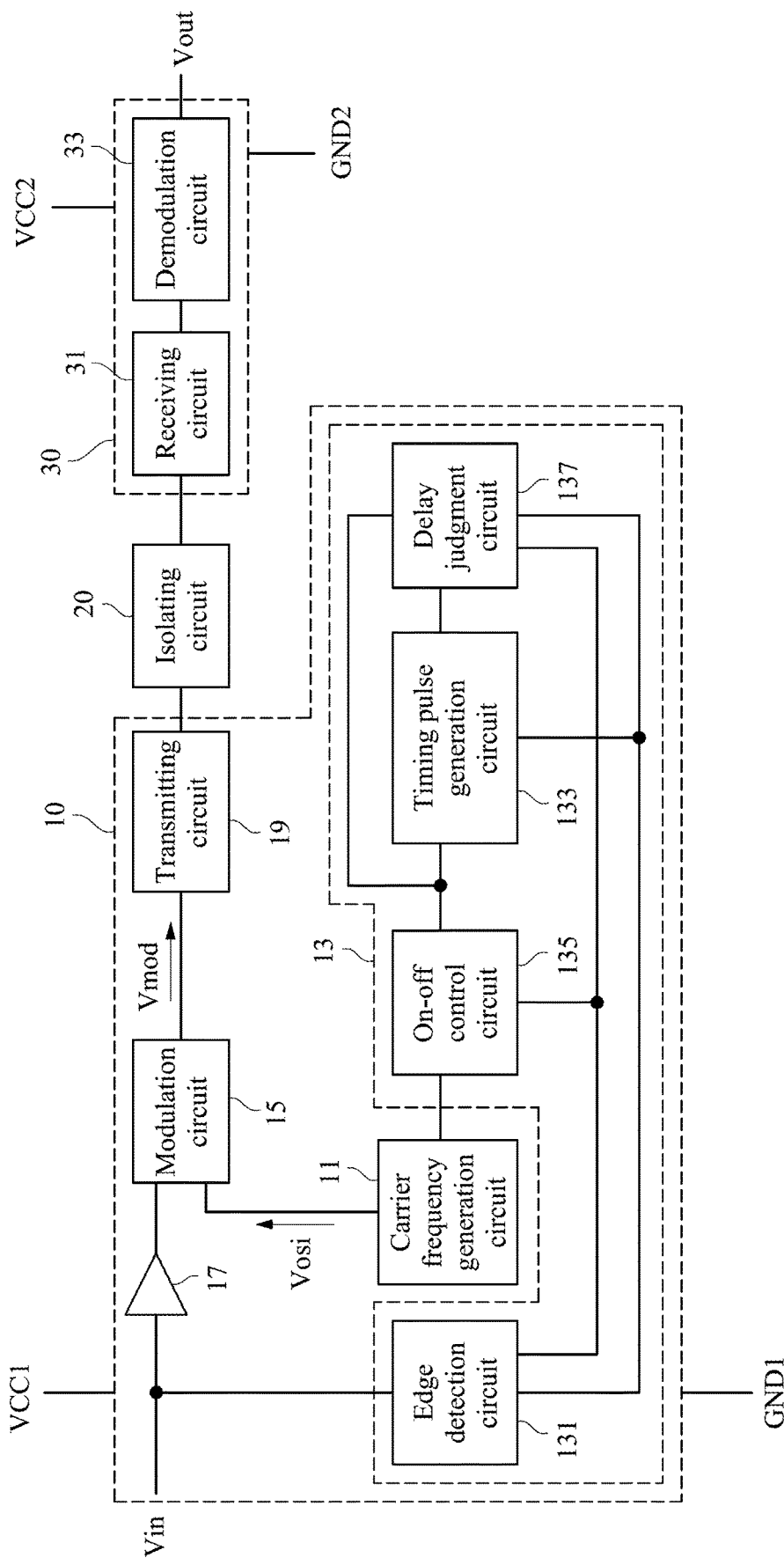
FIG. 1 is a block diagram of an isolation integrated circuit according to some embodiments of the present disclosure.

Please refer to FIG. 1 which is a block diagram of an isolation integrated circuit 100 according to some embodiments of the present disclosure. In some embodiments, the isolation integrated circuit 100 includes a primary circuit 10, an isolating circuit 20, and a secondary circuit 30. In particular, the isolation integrated circuit 100 may be a gate driver.

In some embodiments, as shown in FIG. 1, one end of the isolating circuit 20 is coupled to an output end of the primary circuit 10 and the other end of the isolating circuit 20 is coupled to an input end of the secondary circuit 30 to provide electrical insulation between the primary circuit 10 and the secondary circuit 30 in the isolation integrated circuit 100 according to system requirements. Accordingly, a first supply voltage VCC1 and a first grounding voltage GND1 may be used as operating voltages of the primary circuit 10, and a second supply voltage VCC2 different from the first supply voltage VCC1 and a second grounding voltage GND2 different from the first grounding voltage GND1 may be used as operating voltages of the secondary circuit 30. In particular, the isolating circuit 20 may be implemented with insulating elements such as transformers and capacitors.

In some embodiments, while ensuring voltage isolation (i.e., the electrical insulation as described above) between the primary circuit 10 and the secondary circuit 30, the isolating circuit 20 may also act as a communication interface between the primary circuit 10 and the secondary circuit 30 to allow data, signals and/or information to be transmitted from the primary circuit 10 to the secondary circuit 30, thereby making the isolation integrated circuit 100 operating normally.

In some embodiments, as shown in FIG. 1, the primary circuit 10 includes a carrier frequency generation circuit 11, a carrier frequency control circuit 13, a modulation circuit 15, a buffer circuit 17 and a transmitting circuit 19. In particular, the modulation circuit 15 is electrically coupled to the carrier frequency generation circuit 11, the buffer circuit 17 and the transmitting circuit 19, and the carrier frequency control circuit 13 is electrically coupled to the carrier frequency generation circuit 11. One end of the isolating circuit 20 is coupled to the transmitting circuit 19 of the primary circuit 10 through the output end of the primary circuit 10. Also, the secondary circuit 30 includes a receiving circuit 31 and a demodulation circuit 33. The receiving circuit 31 is coupled to the other end of the isolating circuit 20 through the input end of the secondary circuit 30, and the demodulation circuit 33 is electrically coupled to the receiving circuit 31.

Figure 2:
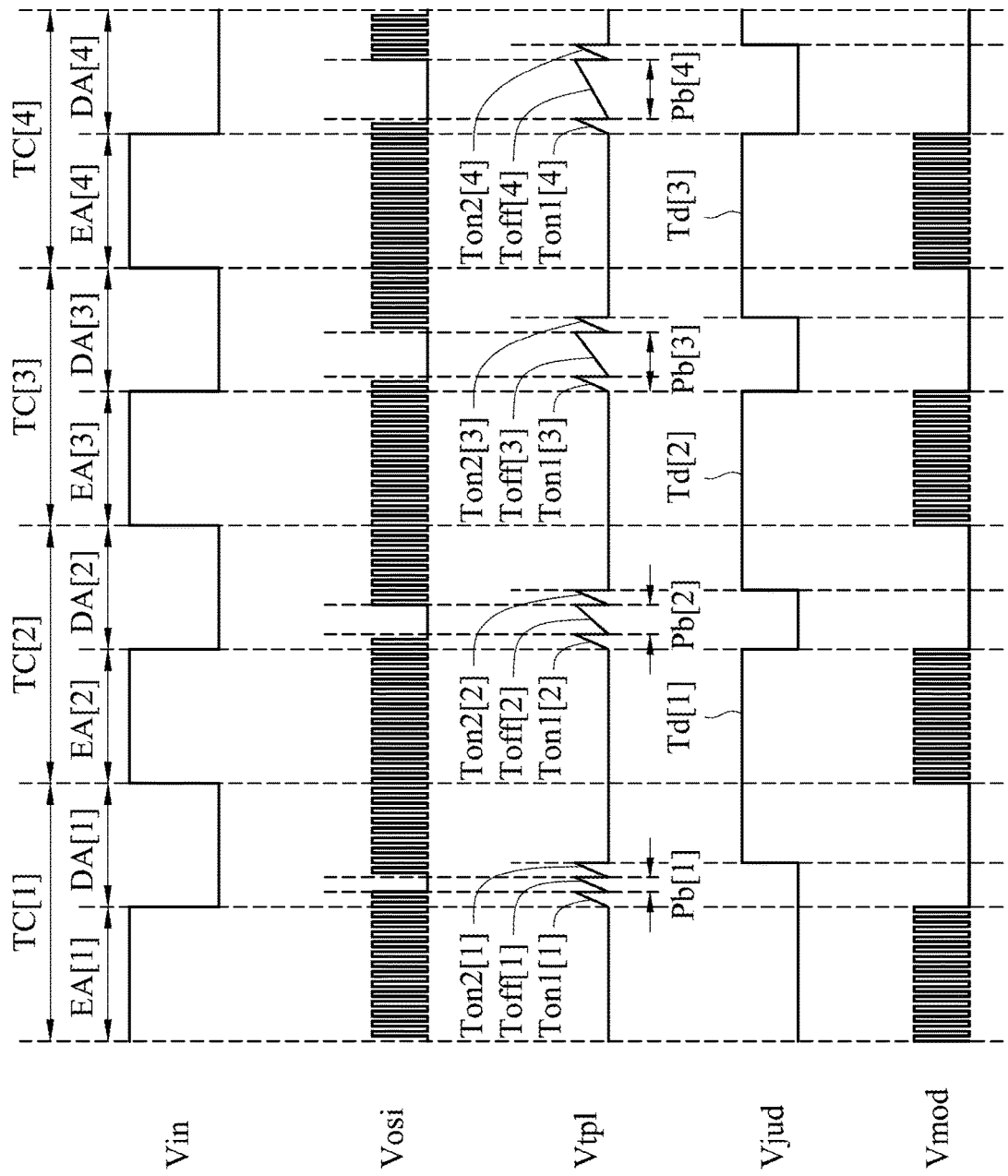
FIG. 2 is a time sequence diagram of some signals associated with an operation of a primary circuit according to some embodiments of the present disclosure.

Then, an operation of the primary circuit 10 is further illustrated with reference to FIGS. 1 and 2, where FIG. 2 is a time sequence diagram of some signals associated with the operation of the primary circuit 10 according to some embodiments of the present disclosure.

In some embodiments, as shown in FIG. 1, the primary circuit 10 is configured to receive an input signal Vin. Further, as shown in FIG. 2, the input signal Vin is a periodic signal, such as a pulse width modulation (PWM) signal, and has a period TC. In particular, a frequency of the input signal Vin may be 100 to 1M Hz, and the reciprocal of the frequency of the input signal Vin is the period TC.

In some embodiments, during each period TC, the input signal Vin is in an enabling level for a period of time and in a disabling level for another period of time. In other words, as shown in FIG. 2, each period TC of the input signal Vin has an enabling period EA (where the input signal Vin is in the enabling level) and a disabling period DA (where the input signal Vin is in the disabling level).

For clarity and better comprehension, in FIG. 2, the numbered indexes [1]-[4] are used to indicate individual elements or signals respectively, but are not intended to limit the quantity of the elements or signals to a specific number. If an element or signal symbol is mentioned without being attached by an index, it may refer to any member of an element/signal set to which it belongs. For example, period TC refers to an unspecified one in the periods TC[1]-TC[4].

In some embodiments, as shown in FIG. 1, the carrier frequency generation circuit 11 is configured to generate a carrier frequency signal Vosi. The carrier frequency signal Vosi is also a periodic signal, and in one embodiment, the frequency of the carrier frequency signal Vosi may be about 500M Hz. It can thus be seen that the frequency of the carrier frequency signal Vosi is higher than the frequency of the input signal Vin. In particular, the carrier frequency generation circuit 11 can be implemented by means of an oscillator.

In some embodiments, as shown in FIG. 1, the modulation circuit 15 is configured to receive the input signal Vin buffered by the buffer circuit 17 and the carrier frequency signal Vosi, and to output a modulation signal Vmod according to the input signal Vin and the carrier frequency signal Vosi for the transmitting circuit 19 to couple the modulation signal Vmod to the isolating circuit 20. In particular, the modulation circuit 15 can generate the modulation signal Vmod by modulating the input signal Vin with the carrier frequency signal Vosi. As shown in FIG. 2, during the enabling period EA of the input signal Vin, the modulation circuit 15 controls the modulation signal Vmod to oscillate at the frequency of the carrier frequency signal Vosi according to the input signal Vin being in the enabling level. During the disabling period DA of the input signal Vin, the modulation circuit 15 controls the modulation signal Vmod to stop oscillating according to the input signal Vin being in the disabling level.

From the above description of the generation of the modulation signal Vmod, it can be seen that the carrier frequency signal Vosi basically plays no role in the generation of the modulation signal Vmod when the input signal Vin is in the disabling level. However, in some related arts, the carrier frequency signal is continuously output by an oscillator. In other words, regardless of whether the input signal is in the enabling level or the disabling level, the oscillator will not stop outputting the carrier frequency signal, which results in an increase in the power consumption of the entire circuit in related arts.

Accordingly, in the present disclosure, the carrier frequency control circuit 13 is employed to control the carrier frequency generation circuit 11 to stop outputting the carrier frequency signal Vosi within an adjustable length of time when the input signal Vin is in the disabling level (i.e., the disabling period DA in FIG. 2).

In some embodiments, as shown in FIG. 1, the carrier frequency control circuit 13 includes an edge detection circuit 131, a timing pulse generation circuit 133, an on-off control circuit 135, and a delay judgment circuit 137. The carrier frequency control circuit 13 is configured to receive the input signal Vin through the edge detection circuit 131. The timing pulse generation circuit 133 is electrically coupled to the edge detection circuit 131. The on-off control circuit 135 is electrically coupled to the carrier frequency generation circuit 11, the edge detection circuit 131, the timing pulse generation circuit 133 and the delay judgment circuit 137. Also, the delay judgment circuit 137 is electrically coupled to the edge detection circuit 131 and the timing pulse generation circuit 133.

Figure 3A:
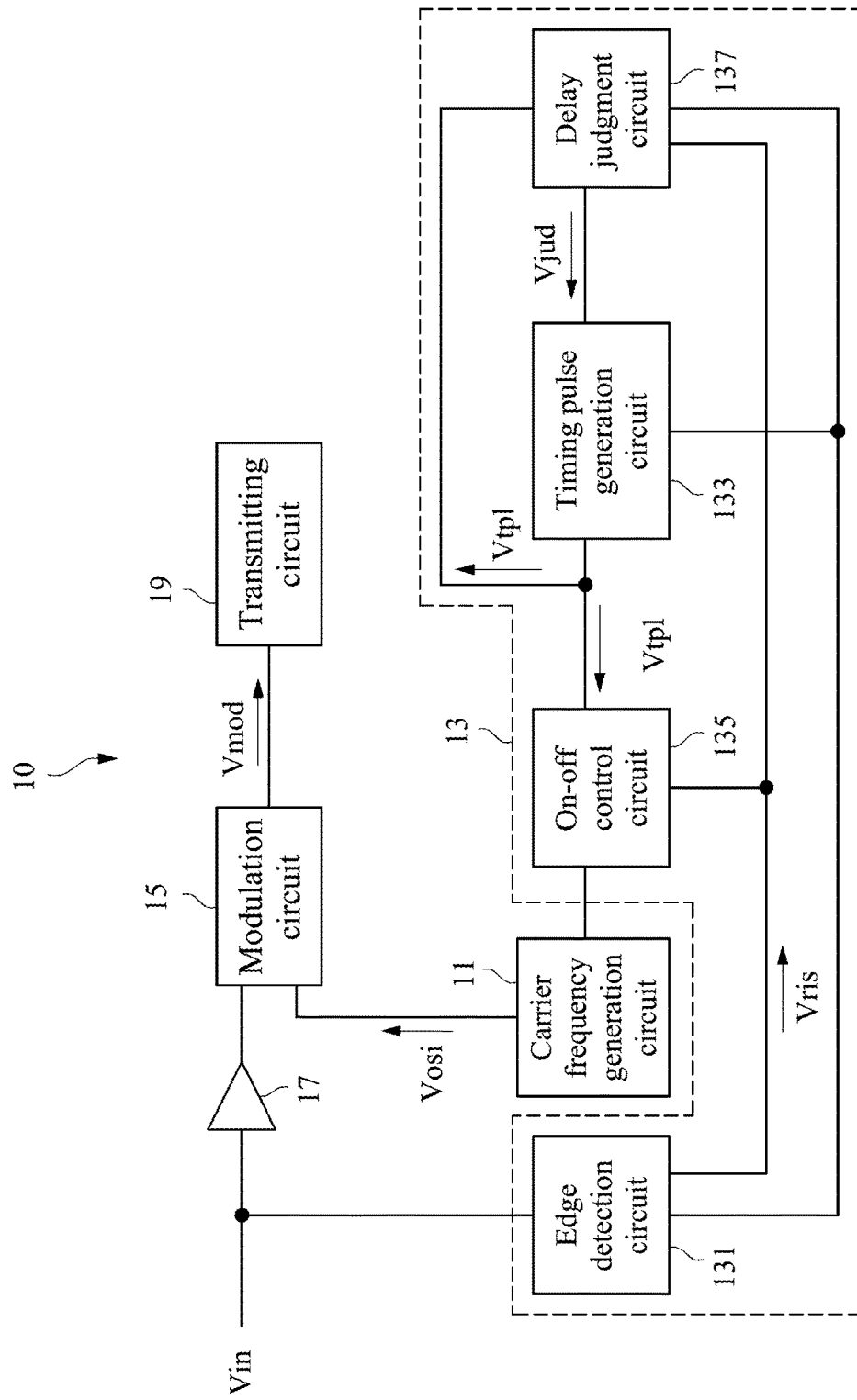
FIG. 3A is a schematic diagram of an operation of a carrier frequency control circuit during an enabling period of an input signal according to some embodiments of the present disclosure.
Figure 3B:
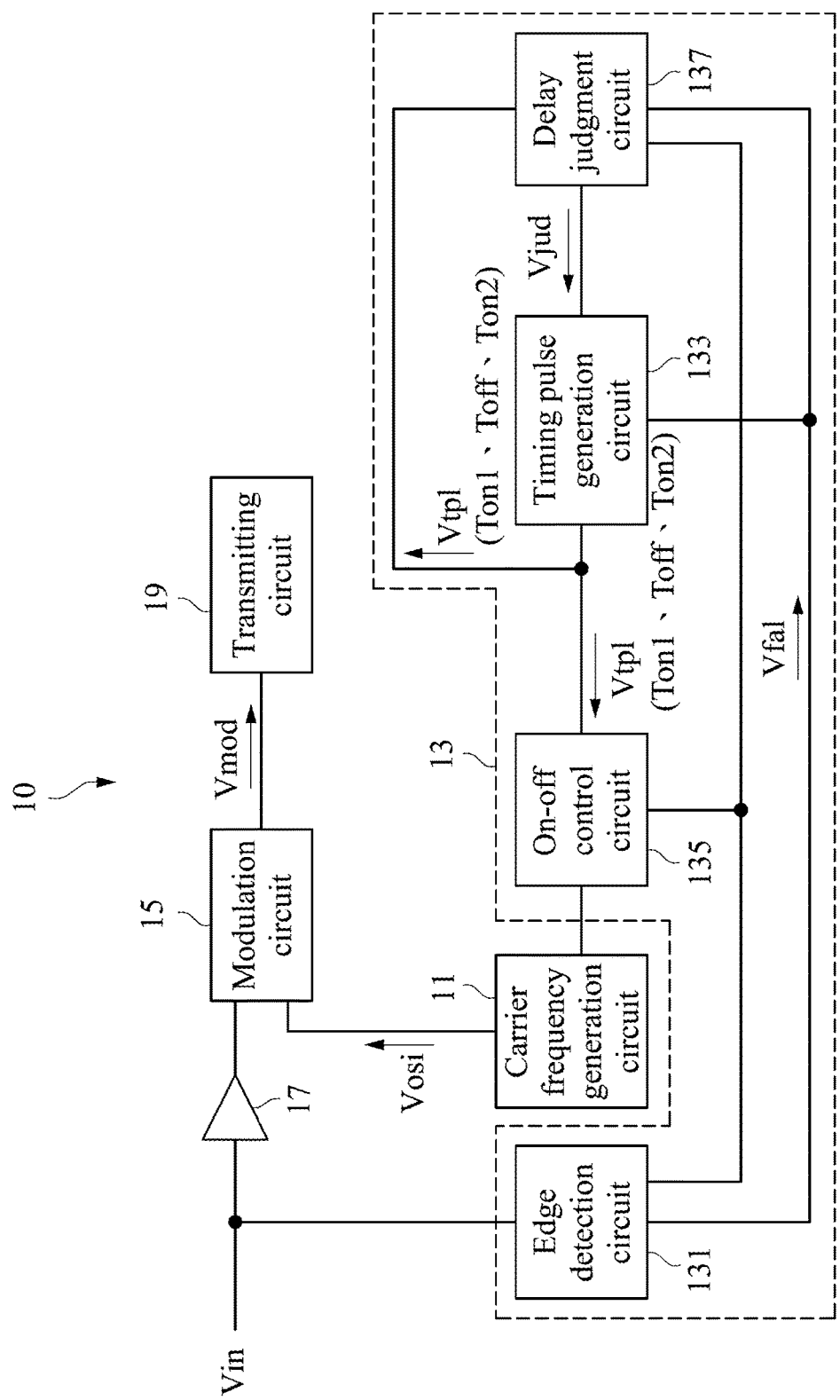
FIG. 3B is a schematic diagram of an operation of the carrier frequency control circuit during a disabling period of the input signal according to some embodiments of the present disclosure.

Then, an operation of the carrier frequency control circuit 13 is further illustrated with reference to FIGS. 2 and 3A-3B, where FIG. 3A is a schematic diagram of the operation of the carrier frequency control circuit 13 during the enabling period EA of the input signal Vin according to some embodiments of the present disclosure; and FIG. 3B is a schematic diagram of the operation of the carrier frequency control circuit 13 during the disabling period DA of the input signal Vin according to some embodiments of the present disclosure.

In some embodiments, the input signal Vin is in the enabling level, and an example is illustrated in FIG. 3A, where the edge detection circuit 131 outputs a rising signal Vris according to the input signal Vin in the enabling level. In other words, the edge detection circuit 131 outputs the rising signal Vris during the enabling period EA of the input signal Vin. The on-off control circuit 135 controls the carrier frequency generation circuit 11 to output the carrier frequency signal Vosi according to the rising signal Vris. In particular, after receiving the rising signal Vris, the on-off control circuit 135 can generate an enable signal (not shown in the figure) to the carrier frequency generation circuit 11. Then, the carrier frequency generation circuit 11 outputs the carrier frequency signal Vosi after receiving the enable signal. Therefore, as shown in FIG. 2, during the enabling period EA of the input signal Vin, the carrier frequency generation circuit 11 outputs the carrier frequency signal Vosi to allow the modulation circuit 15 to control the modulation signal Vmod to oscillate at the frequency of the carrier frequency signal Vosi.

In some embodiments, the input signal Vin is in the disabling level, and an example is illustrated in FIG. 3B, where the edge detection circuit 131 outputs a falling signal Vfal according to the input signal Vin in the disabling level. In other words, the edge detection circuit 131 outputs the falling signal Vfal during the disabling period DA of the input signal Vin. In some embodiments, as shown in FIGS. 3A and 3B, the timing pulse generation circuit 133 is configured to output a frequency filtering signal Vtpl into the on-off control circuit 135. Also, as shown in FIGS. 2 and 3B, after receiving the falling signal Vfal, the timing pulse generation circuit 133 generates a first buffered pulse Ton1, a timing pulse Toff, and a second buffered pulse Ton2 in sequence by adjusting the voltage level of the frequency filtering signal Vtpl.

In some further embodiments, such as the one shown in FIG. 2, the frequency filtering signal Vtpl is at a reference voltage level during the enabling period EA[1] of the input signal Vin. When the disabling period DA[1] is entered (i.e., when the timing pulse generation circuit 133 receives the falling signal Vfal), the timing pulse generation circuit 133 rises the voltage level of the frequency filtering signal Vtpl from the reference voltage level to a preset voltage level at a first slope, and then immediately lowers the voltage level of the frequency filtering signal Vtpl from the preset voltage level back to the reference voltage level to generate a first buffered pulse Ton1[1].

After generating the first buffered pulse Ton1[1], the timing pulse generation circuit 133 rises the voltage level of the frequency filter signal Vtpl from the reference voltage level to the preset voltage level at a second slope, and then immediately lowers the voltage level of the frequency filter signal Vtpl from the preset voltage level back to the reference voltage level to generate a timing pulse Toff[1].

After the timing pulse Toff[1] is generated, the timing pulse generation circuit 133 rises the voltage level of the frequency filter signal Vtpl from the reference voltage level to the preset voltage level at a third slope, and then immediately lowers the voltage level of the frequency filter signal Vtpl from the preset voltage level back to the reference voltage level to generate a second buffered pulse Ton2[1].

Also, after the second buffered pulse Ton2[1] is generated, the timing pulse generation circuit 133 keeps the voltage level of the frequency filter signal Vtpl at the reference voltage level until the disabling period DA[2] is entered (i.e., the timing pulse generation circuit 133 receives a subsequent falling signal Vfal), and then adjusts the voltage level of the frequency filtering signal Vtpl again to generate a first buffered pulse Ton1[2], a timing pulse Toff[2] and a second buffered pulse Ton2[2] in sequence.

In some embodiments, the on-off control circuit 135 controls the carrier frequency generation circuit 11 to output the carrier frequency signal Vosi according to the first buffered pulse Ton1, controls the carrier frequency generation circuit 11 to stop outputting the carrier frequency signal Vosi according to the timing pulse Toff, and controls the carrier frequency generation circuit 11 to output the carrier frequency signal Vosi according to the second buffered pulse Ton2. Accordingly, as shown in FIG. 2, during the disabling period DA of the input signal Vin, the output of the carrier frequency signal Vosi is remained during the output period of the first buffered pulse Ton1, stopped during the output period Pb of the timing pulse Toff, and is resumed during the output period of the second buffered pulse Ton2. In addition, the carrier frequency signal Vosi remains being outputted after the falling edge of the second buffered pulse Ton2.

From the above description on the first buffered pulse Ton1, the timing pulse Toff and the second buffered pulse Ton2, it can be seen that the first buffered pulse Ton1, the timing pulse Toff and the second buffered pulse Ton2 can respectively be ramp pulses. Accordingly, in some further embodiments, during the disabling period DA of the input signal Vin, the on-off control circuit 135 is configured to count the number of the ramp pulses received by itself, and to control the carrier frequency generation circuit 11 to stop outputting the carrier frequency signal Vosi when the second ramp pulse is received (i.e., when the timing pulse Toff is received).

According to the above embodiment, referring to the frequency filtering signal Vtpl shown in FIG. 2, the timing pulse generation circuit 133 generates the first buffered pulse Ton1, the timing pulse Toff, and the second buffered pulse Ton2 altogether as a single periodic signal to the on-off control circuit 135. However, the present disclosure is not limited to the above. In some embodiments, the timing pulse generation circuit 133 generates the first buffered pulse Ton1, the timing pulse Toff and the second buffered pulse Ton2 as three independent signals to the on-off control circuit 135. For example, when the falling signal Vfal is received, the timing pulse generation circuit 133 generates the first buffered pulse Ton1 by adjusting a voltage level of the first signal. After the first buffered pulse Ton1 is generated, the timing pulse generation circuit 133 generates the timing pulse Toff by adjusting a voltage level of the second signal. After the timing pulse Toff is generated, the timing pulse generation circuit 133 generates the second buffered pulse Ton2 by adjusting a voltage level of the third signal.

In some embodiments, as shown in FIGS. 3A and 3B, the delay judgment circuit 137 is configured to receive the frequency filtering signal Vtpl from the timing pulse generation circuit 133, to receive the rising signal Vris and the falling signal Vfal from the edge detection circuit 131, and to output a judgment signal Vjud to control the timing pulse generation circuit 133.

In some embodiments, as shown in FIG. 2, the sequential order of the falling edge of the second buffered pulse Ton2[1] in the period TC[1] is followed by the sequential order of the rising edge of the input signal Vin in the period TC[2] (i.e., the start time of the enabling period EA[2]). Accordingly, the delay judgment circuit 137 detects the falling edge of the second buffered pulse Ton2[1] before receiving the rising signal Vris corresponding to the period TC[2]. When the falling edge of the second buffered pulse Ton2[1] is detected but the rising signal Vris corresponding to the period TC[2] is not received yet, the delay judgment circuit 137 generates a delay pulse Td[1] to the timing pulse generation circuit 133 by adjusting the voltage level of the judgment signal Vjud. After receiving the delay pulse Td[1], the timing pulse generation circuit 133 adjusts the timing pulse Toff[2] corresponding to the period TC[2]. For example, as shown in FIG. 2, the output period Pb[2] of the timing pulse Toff[2] is increased by the timing pulse generation circuit 133 and is thus longer than the output period Pb[1] of the timing pulse Toff[1].

By analogy with the above description, in the embodiment shown in FIG. 2, the delay judgment circuit 137 generates a delay pulse Td[2] by adjusting the voltage level of the judgment signal Vjud to control the timing pulse generation circuit 133 to increase an output period Pb[3] of a timing pulse Toff[3] corresponding to the period TC[3], and then generates a delay pulse Td [3] by adjusting the voltage level of the judgment signal Vjud to control the timing pulse generation circuit 133 to increase an output period Pb[4] of a timing pulse Toff[4] corresponding to the period TC[4].

In some further embodiments, in terms of length of time, the output period Pb[2] of the timing pulse Toff[2] is equal to the sum of the output period Pb[1] of the timing pulse Toff[1] and the output period Pb[1] of the timing pulse Toff[1]; the output period Pb[3] of the timing pulse Toff[3] is equal to the sum of the output period Pb[2] of the timing pulse Toff[2] and the output period Pb[1] of the timing pulse Toff[1]; and the output period Pb[4] of the timing pulse Toff[4] is equal to the sum of the output period Pb[3] of the timing pulse Toff[3] and the output period Pb[1] of the timing pulse Toff[1]. In other words, the output period Pb of the timing pulse Toff corresponding to the subsequent period TC is equal to the sum of the output period Pb of the timing pulse Toff corresponding to the current period TC and the output period Pb[1] of the timing pulse Toff[1] corresponding to the first period TC[1].

Also, in some embodiments, in terms of length of time, the output period Pb[1] of the timing pulse Toff[1] is equal to the output period of the first buffered pulse Ton1[1], and equal to the output period of the second buffered pulse Ton2[1]; the output period Pb[2] of the timing pulse Toff[2] is equal to twice the output period of the first buffered pulse Ton1[2], and equal to twice the output period of the second buffered pulse Ton2[2]; the output period Pb[3] of the timing pulse Toff[3] is equal to three times the output period of the first buffered pulse Ton1 [3], and equal to three times the output period of the second buffered pulse Ton2 [3]; and the output period Pb[4] of the timing pulse Toff[4] is equal to four times the output period of the first buffered pulse Ton1 [4], and equal to four times the output period of the second buffered pulse Ton2 [4]. Thus, regarding the timing pulse Toff, the first buffered pulse Ton1 and the second buffered pulse Ton2 corresponding to the same period TC, in terms of length of the time, the output period Pb of the timing pulse Toff is equal to M times the output period of the first buffered pulse Ton1, and is equal to M times the output period of the second buffered pulse Ton2, where M is a positive integer.

In particular, in some embodiments, the output period of the first buffered pulse Ton1 is 20-50 nanoseconds (ns), and the output period of the second buffered pulse Ton2 is 20-50 nanoseconds.

It should be understood that in the subsequent periods TC after the period TC[4], the output period Pb of the timing pulse Toff may be excessively increased, causing the sequential order of the falling edge of the second buffered pulse Ton2 in the current period TC to be after the sequential order of the rising edge of the input signal Vin in the subsequent period TC or after the sequential order of the generation of the rising signal Vris in the subsequent period TC. In this situation, the delay judgment circuit 137 will not generate the delay pulse Td into the timing pulse generation circuit 133, so that the output period Pb of the timing pulse Toff corresponding to the subsequent period TC remains the same as the output period Pb of the timing pulse Toff of the current period TC.

In addition, the carrier frequency control circuit 13 may, due to some non-ideal factors, cause the sequential order of the falling edge of the timing pulse Toff in the current period TC to be after the sequential order of the rising edge of the input signal Vin in the subsequent period TC or after the sequential order of the generation of the rising signal Vris in the subsequent period TC. In this situation, the on-off control circuit 135 receives the timing pulse Toff during the enabling period EA. Nonetheless, since the edge detection circuit 131 also outputs the rising signal Vris to the on-off control circuit 135 in response to the enabling period EA, the on-off control circuit 135 still controls the carrier frequency generation circuit 11 to output the carrier frequency signal Vosi according to the rising signal Vris.

It can also be seen from the illustration of the embodiments in FIGS. 2 and 3A-3B above that the carrier frequency control circuit 13 is configured to detect the enabling period EA and the disabling period DA of the input signal Vin, to control the carrier frequency generation circuit 11 to output the carrier frequency signal Vosi during the enabling period EA, and also to control the carrier frequency generation circuit 11 to stop outputting the carrier frequency signal Vosi in the output period Pb of the timing pulse Toff during the disabling period DA.

It should be understood that the timing pulse Toff of the present disclosure is not limited to that shown in FIG. 2. In some embodiments, the timing pulse Toff can be configured to have the same output period Pb for each period TC, and thus the delay judgment circuit 137 in FIG. 1 can be omitted.

Also, the frequency filtering signal Vtpl of the present disclosure is not limited to those shown in FIGS. 2 and 3B. In some embodiments, the timing pulse generation circuit 133 generates the timing pulse Toff by adjusting the voltage level of the frequency filtering signal Vtpl after receiving the falling signal Vfal. Thus, the first buffered pulse Ton1 and the second buffered pulse Ton2 can be omitted. Correspondingly, the delay judgment circuit 137 determines whether to generate the delay pulse Td into the timing pulse generation circuit 133 according to the falling edge of the timing pulse Toff.

In some embodiments, when the falling edge of the timing pulse Toff corresponding to the current period TC is detected and the rising signal Vris corresponding to the subsequent period TC is not received yet (that is, the sequential order of the falling edge of the timing pulse Toff corresponding to the current period TC is followed by the sequential order of the rising edge of the input signal Vin corresponding to the subsequent period TC), the delay judgment circuit 137 generates the delay pulse Td by adjusting the voltage level of the judgment signal Vjud to control the timing pulse generation circuit 133 to increase the output period Pb of the timing pulse Toff corresponding to the subsequent period TC.

In some embodiments, when the rising signal Vris corresponding to the subsequent period TC is received but the falling edge of the timing pulse Toff corresponding to the current period TC is not detected yet (that is, the sequential order of the falling edge of the timing pulse Toff in the current period TC is after the sequential order of the rising edge of the input signal Vin in the subsequent period TC), the delay judgment circuit 137 will not generate the delay pulse Td into the timing pulse generation circuit 133, so that the output period Pb of the timing pulse Toff corresponding to the subsequent period TC remains the same as the output period Pb of the timing pulse Toff of the current period TC. As explained above, although in this case the on-off control circuit 135 receives the timing pulse Toff during the enabling period EA, the on-off control circuit 135 still controls the carrier frequency generation circuit 11 to output the carrier frequency signal Vosi according to the rising signal Vris.

In summary, in the above embodiments, when the output period Pb of the timing pulse Toff (e.g., the output period Pb[1] of the timing pulse Toff[1]) does not overlap with the enabling period EA (e.g., the enabling period EA[2]) directly after the timing pulse Toff, the output period Pb of the subsequent timing pulse Toff (e.g., the output period Pb[2] of the timing pulse Toff[2]) will be adjusted.

Accordingly, when the output period Pb of the timing pulse Toff partially overlaps with the enabling period EA directly after the timing pulse Toff, the output period Pb of the subsequent timing pulse Toff will not be adjusted. Also, when a time interval between the timing pulse Toff and the enabling period EA directly after the timing pulse Toff is shorter than the output period of the second buffered pulse Ton2 (i.e., the sequential order of the falling edge of the second buffered pulse Ton2 corresponding to the current period TC is after the sequential order of the rising edge of the input signal Vin corresponding to the subsequent period TC), the output period Pb of the subsequent timing pulse Toff will not be adjusted.

Figure 4:
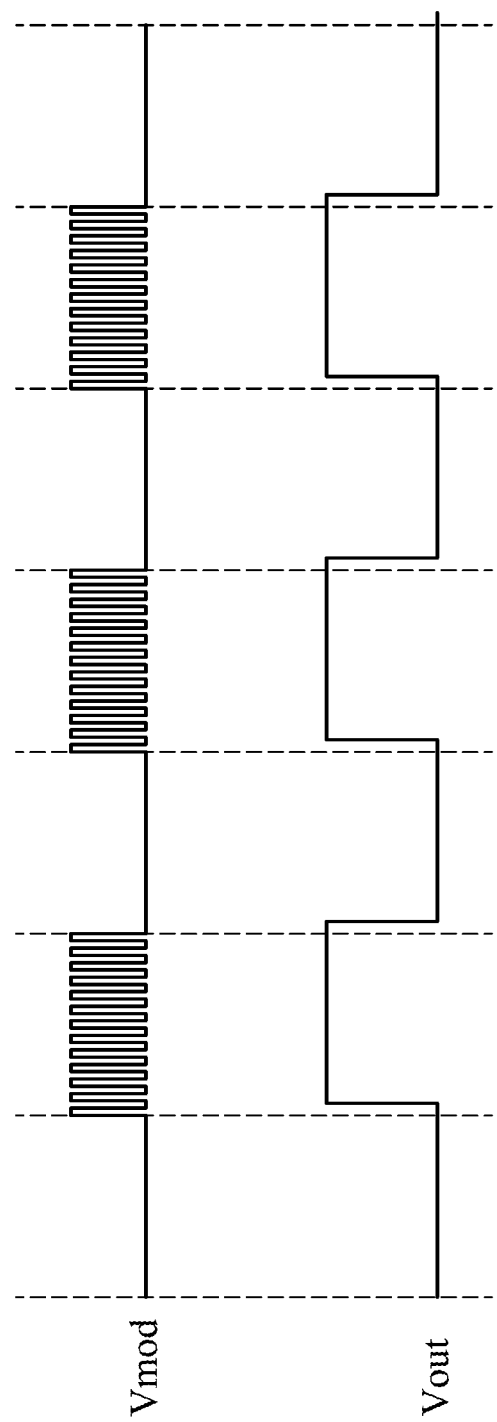
FIG. 4 is a schematic diagram of a modulation signal and an output signal according to some embodiments of the present disclosure.

Please refer to FIG. 1 and FIG. 4 together, FIG. 4 is a schematic diagram of the modulation signal Vmod and the output signal Vout according to some embodiments of the present disclosure. In some embodiments, as shown in FIG. 1, the isolating circuit 20 is configured to couple and transmit the modulation signal Vmod from the primary circuit 10 to the secondary circuit 30 so that the secondary circuit 30 generates an output signal Vout. In particular, the receiving circuit 31 receives and transmits a signal substantially identical to the modulation signal Vmod to the demodulation circuit 33, and the demodulation circuit 33 demodulates the signal substantially identical to the modulation signal Vmod to generate the output signal Vout. It can be seen that the secondary circuit 30 generates the output signal Vout according to the modulation signal Vmod. Also, in some embodiments, as shown in FIGS. 2 and 4, the waveform of the output signal Vout is substantially the same as the waveform of the input signal Vin.

Figure 5:
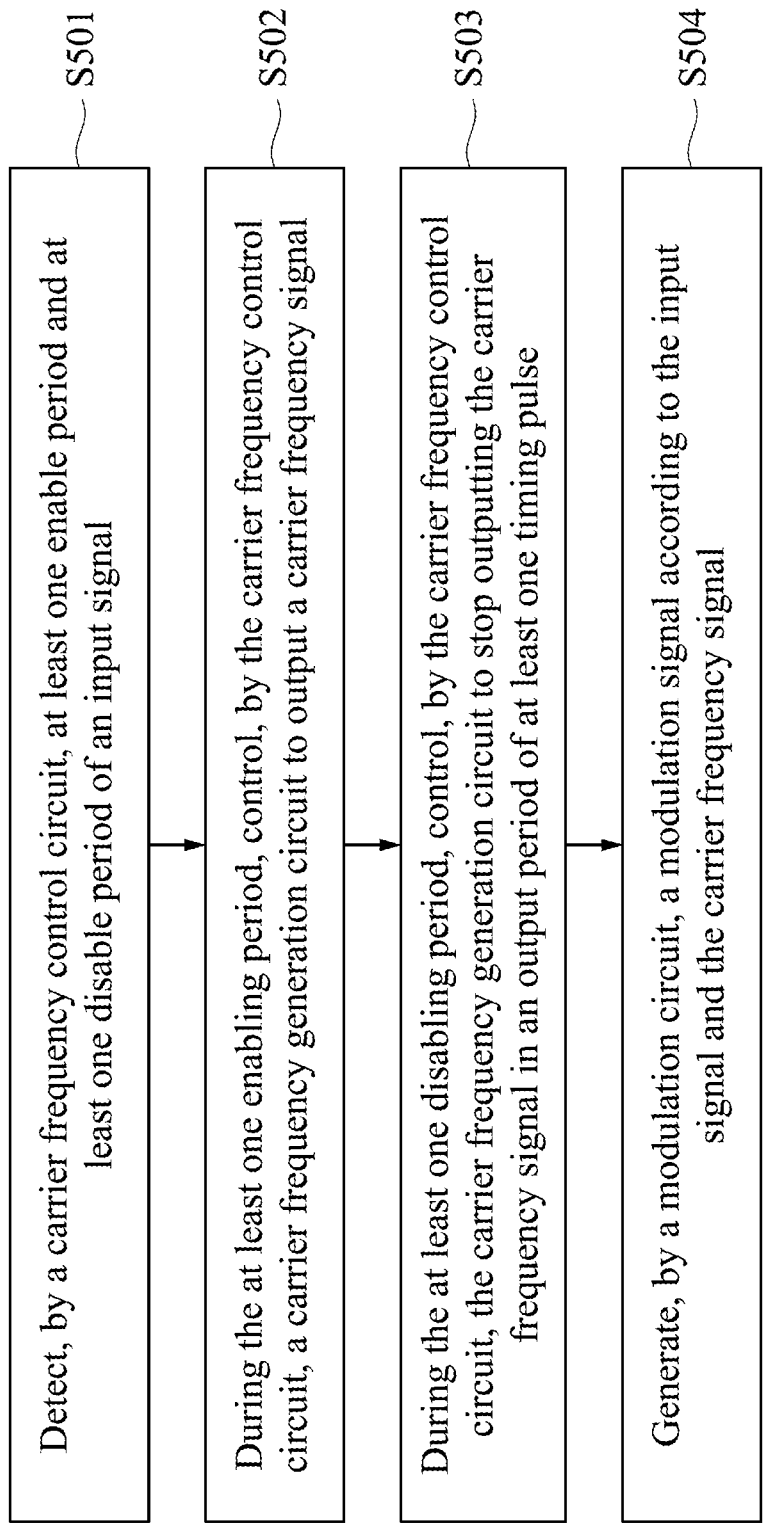
FIG. 5 is a flow diagram of a modulation signal generation method according to some embodiments of the present disclosure.

Please refer to FIG. 5 which is a flow diagram of a modulation signal generation method 500 according to some embodiments of the present disclosure. In some embodiments, the modulation signal generation method 500 may be performed by an isolation integrated circuit 100 in FIG. 1. As shown in FIG. 5, the modulation signal generation method 500 includes steps S501-S504.

In step S501, a carrier frequency control circuit 13 detects at least one enabling period EA and at least one disabling period DA of an input signal Vin. In some embodiments, the carrier frequency control circuit 13 detects the enabling period EA and the disabling period DA of the input signal Vin by an edge detection circuit 131. In particular, as shown in FIGS. 3A and 3B, the edge detection circuit 131 is configured to output a rising signal Vris in response to the enabling period EA of the input signal Vin, and to output a falling signal Vfal in response to the disabling period DA of the input signal Vin.

In step S502, during the at least one enabling period EA, the carrier frequency control circuit 13 controls a carrier frequency generation circuit 11 to output a carrier frequency signal Vosi. In some embodiments, as shown in FIGS. 2 and 3A, an on-off control circuit 135 of the carrier frequency control circuit 13 controls the carrier frequency generation circuit 11 to output a carrier frequency signal Vosi according to the rising signal Vris.

In step S503, during the at least one disabling period DA, the carrier frequency control circuit 13 controls the carrier frequency generation circuit 11 to stop outputting the carrier frequency signal Vosi in an output period Pb of at least one timing pulse Toff. In some embodiments, as shown in FIGS. 2 and 3B, a timing pulse generation circuit 133 in the carrier frequency control circuit 13 generates a first buffered pulse Ton1, a timing pulse Toff, and a second buffered pulse Ton2 into the on-off control circuit 135 in sequence by adjusting a voltage level of a frequency filtering signal Vtpl according to the falling signal Vfal, so that the on-off control circuit 135 controls the carrier frequency generation circuit 11 to stop outputting the carrier frequency signal Vosi in the output period Pb of the timing pulse Toff.

In step S504, a modulation circuit 15 generates a modulation signal Vmod according to the input signal Vin and the carrier frequency signal Vosi. In some embodiments, as shown in FIGS. 1 and 2, the modulation circuit 15 controls the modulation signal Vmod to oscillate at the frequency of the carrier frequency signal Vosi according to the input signal Vin at the enabling level (i.e., during the enabling period EA of the input signal Vin), and controls the modulation signal Vmod to stop oscillating according to the input signal Vin at the disabling level (i.e., during the disabling period DA of the input signal Vin).

The remaining descriptions on steps S501-S504 may refer to the description on the isolation integrated circuit 100 above, and thus will not be further described here.

According to the above-mentioned embodiments of the present disclosure, the carrier frequency control circuit 13 of the present disclosure detects the enabling period EA and the disabling period DA of the input signal Vin, and during the disabling period DA of the input signal Vin, controls the carrier frequency generation circuit 11 to stop outputting the carrier frequency signal Vosi in the output period Pb of the timing pulse Toff. Therefore, compared to related arts that lack means of stopping output of carrier frequency signals during a disabling period of an input signal, the isolation integrated circuit 100 of the present disclosure can lower the overall power consumption.

Although the present disclosure has been disclosed as above by way of the embodiments, these embodiments are not intended to limit the present disclosure. Those skilled in the art may make various changes and modifications without departing from the spirit and scope of the present disclosure. Therefore, the scope of protection of the present disclosure is to be determined as defined by the appended claims.

What is claimed is:

1. An isolation integrated circuit, comprising:
   a primary circuit, comprising:
   a carrier frequency generation circuit, configured to generate a carrier frequency signal;
   a carrier frequency control circuit, electrically coupled to the carrier frequency generation circuit, and configured to detect at least one enabling period and at least one disabling period of an input signal, to control the carrier frequency generation circuit to output the carrier frequency signal during the at least one enabling period, and to control the carrier frequency generation circuit to stop outputting the carrier frequency signal in an output period of at least one timing pulse during the at least one disabling period, wherein the at least one timing pulse is generated in response to detection of entering the at least one disabling period, and when an output period of one of the at least one timing pulse does not overlap with one of the at least one enabling period directly after the one of the at least one timing pulse, an output period of a subsequent one of the at least one timing pulse is adjusted; and
   a modulation circuit, electrically coupled to the carrier frequency generation circuit, and configured to receive the input signal and the carrier frequency signal, and to output a modulation signal according to the input signal and the carrier frequency signal;
   an isolating circuit, coupled to the primary circuit, and configured to transmit the modulation signal; and
   a secondary circuit, coupled to the isolating circuit, and configured to receive the modulation signal through the isolating circuit and to generate an output signal according to the modulation signal.

2. The isolation integrated circuit according to claim 1, wherein the carrier frequency control circuit comprises:
   an edge detection circuit, configured to output at least one rising signal during the at least one enabling period, and to output at least one falling signal during the at least one disabling period;
   a timing pulse generation circuit, electrically coupled to the edge detection circuit, and configured to output a frequency filtering signal, and to generate the at least one timing pulse by adjusting a voltage level of the frequency filtering signal according to the at least one falling signal; and
   an on-off control circuit, electrically coupled to the carrier frequency generation circuit, the edge detection circuit and the timing pulse generation circuit, and configured to control the carrier frequency generation circuit to output the carrier frequency signal according to the at least one rising signal, and to control the carrier frequency generation circuit to stop outputting the carrier frequency signal according to the at least one timing pulse.

3. The isolation integrated circuit according to claim 2, wherein the carrier frequency control circuit further comprises:
   a delay judgment circuit, electrically coupled to the edge detection circuit and the timing pulse generation circuit, and configured to output a judgment signal to control the timing pulse generation circuit according to the frequency filtering signal, the at least one rising signal and the at least one falling signal.

4. The isolation integrated circuit according to claim 3, wherein the at least one timing pulse comprises a current timing pulse corresponding to a current period of the input signal, and the at least one rising signal comprises a subsequent rising signal corresponding to a subsequent period following the current period; and
   when a falling edge of the current timing pulse is detected and the subsequent rising signal is not received, the delay judgment circuit adjusts a voltage level of the judgment signal to generate a delay pulse to control the timing pulse generation circuit to increase an output period of a subsequent timing pulse corresponding to the subsequent period.

5. The isolation integrated circuit according to claim 4, wherein the output period of the subsequent timing pulse is equal to a sum of an output period of the current timing pulse and an output period of a first timing pulse corresponding to a first period of the input signal in the at least one timing pulse.

6. The isolation integrated circuit according to claim 3, wherein the timing pulse generation circuit is configured to generate at least one first buffered pulse, the at least one timing pulse and at least one second buffered pulse in sequence by adjusting the voltage level of the frequency filtering signal according to the at least one falling signal;
   wherein the on-off control circuit is configured to control the carrier frequency generation circuit to output the carrier frequency signal according to the at least one first buffered pulse, and to control the carrier frequency generation circuit to output the carrier frequency signal according to the at least one second buffered pulse.

7. The isolation integrated circuit according to claim 6, wherein the at least one second buffered pulse comprises a current second buffered pulse corresponding to a current period of the input signal, and the at least one rising signal comprises a subsequent rising signal corresponding to a subsequent period after the current period; and when a falling edge of the current second buffered pulse is detected and the subsequent rising signal is not received, the delay judgment circuit adjusts a voltage level of the judgment signal to generate a delay pulse to control the timing pulse generation circuit to increase an output period of a subsequent timing pulse corresponding to the subsequent period in the at least one timing pulse.

8. The isolation integrated circuit according to claim 6, wherein the output period of the at least one timing pulse is equal to M times an output period of the at least one first buffered pulse, and is equal to M times an output period of the at least one second buffered pulse, respectively, where M is a positive integer.

9. The isolation integrated circuit according to claim 1, wherein a waveform of the output signal is substantially the same as a waveform of the input signal.

10. A carrier frequency control circuit, electrically coupled to a carrier frequency generation circuit, wherein the carrier frequency control circuit is configured to receive an input signal, and comprises:

an edge detection circuit, configured to output at least one rising signal during at least one enabling period of the input signal and to output at least one falling signal during at least one disabling period of the input signal;

a timing pulse generation circuit, electrically coupled to the edge detection circuit, and configured to output a frequency filtering signal and to generate at least one timing pulse by adjusting a voltage level of the frequency filtering signal according to the at least one falling signal, wherein when an output period of one of the at least one timing pulse does not overlap with one of the at least one enabling period directly after the one of the at least one timing pulse, an output period of a subsequent one of the at least one timing pulse will be adjusted; and an on-off control circuit, electrically coupled to the carrier frequency generation circuit, the edge detection circuit and the timing pulse generation circuit, and configured to control the carrier frequency generation circuit to output a carrier frequency signal according to the at least one rising signal, and control the carrier frequency generation circuit to stop outputting the carrier frequency signal according to the at least one timing pulse.

11. The carrier frequency control circuit according to claim 10, wherein the at least one timing pulse comprises a current timing pulse corresponding to a current period of the input signal, and the input signal comprises a subsequent rising edge corresponding to a subsequent period after the current period; and wherein when a sequential order of a falling edge of the current timing pulse is followed by a sequential order of the subsequent rising edge, the timing pulse generation circuit increases an output period of a subsequent timing pulse corresponding to the subsequent period in the at least one timing pulse, so that the output period of the subsequent timing pulse is longer than an output period of the current timing pulse.

12. The carrier frequency control circuit according to claim 11, wherein the output period of the subsequent timing pulse is equal to a sum of the output period of the current timing pulse and an output period of a first timing pulse corresponding to a first period of the input signal in the at least one timing pulse.

13. The carrier frequency control circuit according to claim 10, wherein the timing pulse generation circuit is configured to generate at least one first buffered pulse, the at least one timing pulse and at least one second buffered pulse in sequence by adjusting the voltage level of the frequency filtering signal according to the at least one falling signal;

wherein the on-off control circuit is configured to control the carrier frequency generation circuit to output the carrier frequency signal according to the at least one first buffered pulse, and to control the carrier frequency generation circuit to output the carrier frequency signal according to the at least one second buffered pulse.

14. The carrier frequency control circuit according to claim 13, wherein the at least one second buffered pulse comprises a current second buffered pulse corresponding to a current period of the input signal, and the input signal comprises a subsequent rising edge corresponding to a subsequent period after the current period; and when a sequential order of a falling edge of the current second buffered pulse is followed by a sequential order of the subsequent rising edge, the timing pulse generation circuit increases an output period of a subsequent timing pulse corresponding to the subsequent period in the at least one timing pulse.

15. The carrier frequency control circuit according to claim 13, wherein an output period of the at least one timing pulse is equal to M times an output period of the at least one first buffered pulse, and is equal to M times an output period of the at least one second buffered pulse, respectively, where M is a positive integer.

16. The carrier frequency control circuit according to claim 10, further comprising:

a delay judgment circuit, electrically coupled to the edge detection circuit and the timing pulse generation circuit, and configured to output a judgment signal to control the timing pulse generation circuit according to the frequency filtering signal, the at least one rising signal and the at least one falling signal.

17. The carrier frequency control circuit according to claim 16, wherein the delay judgment circuit is further configured to generate at least one delay pulse by adjusting a voltage level of the judgment signal to control the timing pulse generation circuit to adjust an output period of the at least one timing pulse.

18. A modulation signal generation method implemented with an isolation integrated circuit, wherein the isolation integrated circuit comprises a carrier frequency generation circuit, a carrier frequency control circuit and a modulation circuit, and the modulation signal generation method comprises:

detecting, by the carrier frequency control circuit, at least one enabling period and at least one disabling period of an input signal;

during the at least one enabling period, controlling, by the carrier frequency control circuit, the carrier frequency generation circuit to output a carrier frequency signal;

during the at least one disabling period, controlling, by the carrier frequency control circuit, the carrier frequency generation circuit to stop outputting the carrier frequency signal in an output period of at least one timing pulse, wherein the at least one timing pulse is generated in response to detection of entering the at least one disabling period, and when an output period of one of the at least one timing pulse does not overlap with one of the at least one enabling period directly after the one of the at least one timing pulse, an output period of a subsequent one of the at least one timing pulse is adjusted; and generating, by the modulation circuit, a modulation signal according to the input signal and the carrier frequency signal.

19. The modulation signal generation method according to claim 18, wherein the at least one timing pulse comprises a current timing pulse corresponding to a current period of the input signal, the input signal comprises a subsequent rising edge corresponding to a subsequent period after the current period, and the modulation signal generation method further comprises:

when a sequential order of a falling edge of the current timing pulse is followed by a sequential order of the subsequent rising edge, increasing, by the carrier frequency control circuit, an output period of a subsequent timing pulse corresponding to the subsequent period in the at least one timing pulse, so that the output period of the subsequent timing pulse is longer than an output period of the current timing pulse.

20. The modulation signal generation method according to claim 18, wherein at least one first buffered pulse, the at least one timing pulse and at least one second buffered pulse are generated in sequence in response to the detection of entering the at least one disabling period, and the modulation signal generation method further comprises:

during the at least one disabling period, controlling, by the carrier frequency control circuit, the carrier frequency generation circuit to output the carrier frequency signal in an output period of the at least one first buffered pulse; and during the at least one disabling period, controlling, by the carrier frequency control circuit, the carrier frequency generation circuit to output the carrier frequency signal in an output period of the at least one second buffered pulse.

* * * * *